United States Patent [19]

Ishiguro

[11] Patent Number: 4,485,431

[45] Date of Patent: Nov. 27, 1984

[54] DC-DC CONVERTER

[75] Inventor: Hideo Ishiguro, Yokohama, Japan

[73] Assignee: Hitachi, Ltd., Tokyo, Japan

[21] Appl. No.: 436,942

[22] Filed: Oct. 27, 1982

[30] Foreign Application Priority Data

Nov. 2, 1981 [JP] Japan .................................. 56-174562

[51] Int. Cl.³ ............................................. H02M 3/335
[52] U.S. Cl. ..................................................... 363/20
[58] Field of Search ...................................... 363/20, 21

[56] References Cited

U.S. PATENT DOCUMENTS 4,240,134 12/1980 Nakazawa et al. .................... 363/21
4,318,168 3/1982 Faxon ............................. 363/21 X
4,389,702 6/1983 Clemente et al. ..................... 363/21

FOREIGN PATENT DOCUMENTS 2026260 1/1980 United Kingdom .................. 363/20

Primary Examiner—William M. Shoop
Attorney, Agent, or Firm—Antonelli, Terry & Wands

[57] ABSTRACT

A DC-DC converter in which a DC voltage is intermittently applied to a transformer through a switching circuit performing repeatedly turning on-off operations. An offset is imparted to the voltage waveform applied to the transformer for separating a transition timing of the voltage applied across the switch circuit from that of the current flowing through the switch circuit, to thereby reduce the power loss.

10 Claims, 11 Drawing Figures

DC-DC CONVERTER

BACKGROUND OF THE INVENTION

1. Field of the Invention

The present invention relates generally to a DC-DC converter and in particular concerns a DC-DC converter in which power loss and accompanying heat generation due to switching operation is reduced to a minimum.

2. Description of the Prior Art

In FIG. 1 of the accompanying drawings, there is shown a circuit diagram of a conventional DC-DC converter. In this DC-DC converter circuit, a DC voltage E of a DC power supply source 1 is intermittently applied to the primary winding of a transformer 3 through repeated turn-on and -off operation of a switching circuit 2, whereby a secondary voltage is induced in a secondary winding of the transformer 3 under the influence of changes in the magnetic flux. The secondary voltage thus induced is rectified by a diode 4 and supplied to a load 6 after having been smoothed by a capacitor 5. In the operation of the DC-DC converter described above, a voltage e appearing across the switching circuit 2 and a current i conducted therethrough are of such waveforms as shown in FIG. 2 at (a) and (b), respectively. When changes in the voltage e and the current i in the on-off operation of the switching circuit 2 are traced, a closed loop such as illustrated in FIG. 3 is obtained. The profile of e-i loop is generally of a circular or angular form depending upon the leakage inductance of the transformer 3 and the capacitance of the capacitor 5, and either one of areas, defined by turn-on transition curve and by turn-off transition curve, prevails over the other in size and is fairly large. Thus the power loss, represented by the power product e.i, causes instantaneous heat generation in transistors and other elements constituting the switching circuit 2, degrading the operation efficiency of the DC-DC converter on the whole, to a disadvantage. This unwanted phenomenon may be explained by the fact that the turning on and off of voltage can not be separated from that of the current but both proceeding simultaneously.

As a typical example of the technical fields to which the DC-DC converter according to the present invention may be applied, a digital communication system in which the DC-DC converter is incorporated as a power supply source for each of subscriber or terminal apparatus will be briefly described.

In general, in digital communication over the subscriber's lines, each of the terminal apparatus is connected to a station through two wires, one of which serves to supply a DC power to the terminal apparatus from the station, while the other serves for transmission of digital signals. Assuming that a digital signal to be transmitted to the terminal or subscriber apparatus from the station is represented, for example, by 2 $V_{o-p}$, this signal undergoes attenuation down to about 10 m$V_{o-p}$ at the terminal apparatus in the case the latter is located about 5 km from the station, as is well known in the art. The terminal station has to extract digital or logic values "0" and "1" from the attenuated digital signal 10 m$V_{o-p}$. In this situation, it is noted that when the DC-DC converter is used as the power supply source for the terminal equipment, the rate of voltage change (dv/dt) in the switching operation of the converter is very large and thus may bring about noise as large as 500 m$V_{o-p}$, which makes it impossible to extract the logic values from the digital signal as mentioned above with an acceptable accuracy. Theoretically, the noise may be reduced by smoothing the voltage change (dv/dt). However, in that case, the power loss, as apparent from the description above in conjunction with FIG. 2, will tend to be increased, bringing about considerable heat generation in the switch circuit as well as degradation in the operation efficiency of the DC-DC converter, to disadvantages.

SUMMARY OF THE INVENTION

In view of the above, it is an object of the present invention to provide a DC-DC converter which exhibits an improved operation efficiency, while the power loss brought about upon switching operation can be significantly reduced.

It is another object of the present invention to provide a low noise DC-DC converter which can be employed as a power supply source in digital transmission system.

In view of the above objects, in accordance to the present invention that a step is imparted to the waveform of the voltage applied to the transformer for separating a time interval during which the transition of the voltage (e) applied across the switch circuit takes place from a time interval during which the transition of the current (i) flowing through the switch circuit takes place, so that the transition of the voltage (e) and the current (i) may follow curves which pass by the origin (where e=0 and i=0) as close as possible, to thereby reduce the power loss to a minimum.

DESCRIPTION OF THE PREFERRED EMBODIMENTS

In the following, the invention will be described in detail in conjunction with the exemplary embodiments by referring to FIGS. 4 to 11.

Figure 1:
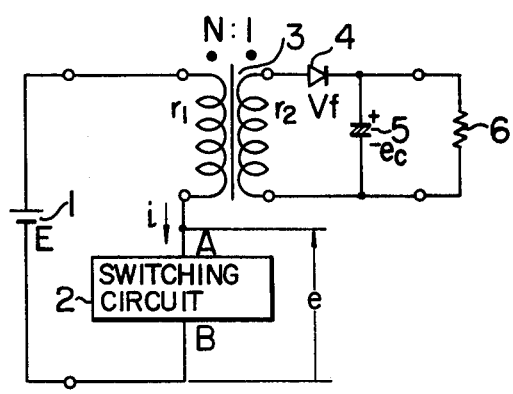
FIG. 1 is a circuit diagram of a hitherto known DC-DC converter.
Figure 2:
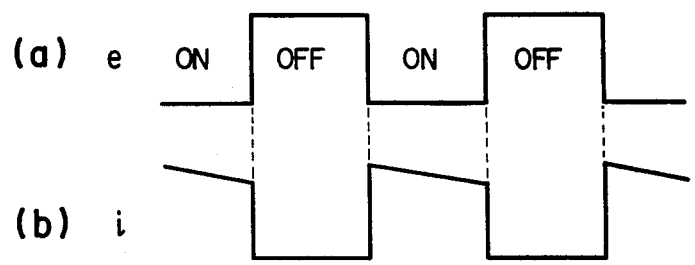
FIGS. 2 and 3 show waveform diagrams of a voltage and a current produced upon switching operation of a switching circuit of the conventional DC-DC converter shown in FIG. 1.
Figure 4:
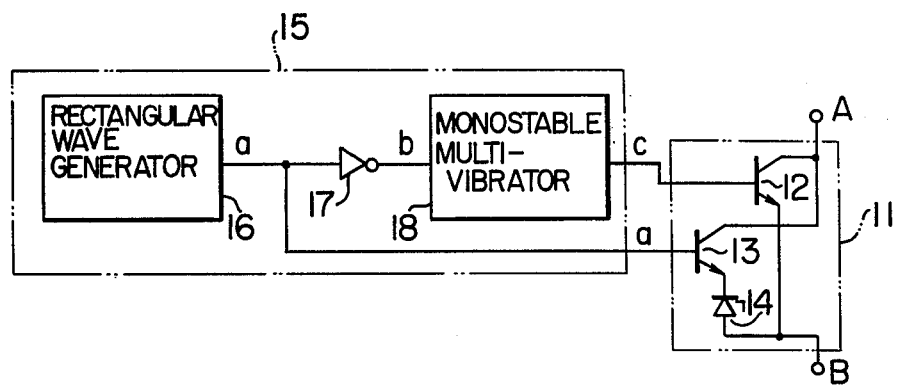
FIG. 4 is a circuit diagram showing a switch circuit incorporated in a DC-DC converter according to a first embodiment of the present invention.
Figure 5:
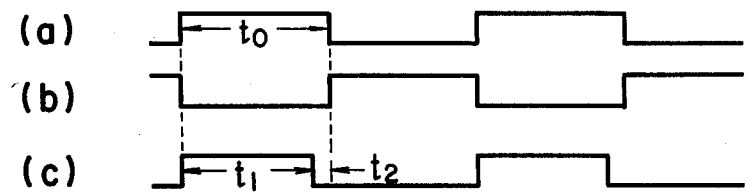
FIG. 5 shows a timing diagram to illustrate operations of major components of the switch circuit shown in FIG. 4.
Figure 6:
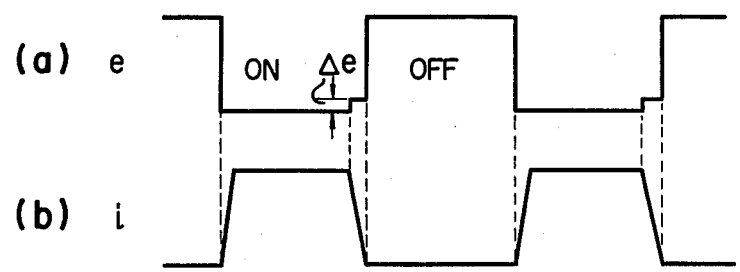
FIGS. 6 and 7 show waveforms of voltage and current produced through switching operation of the switch circuit shown in FIG. 4.
Figure 7:
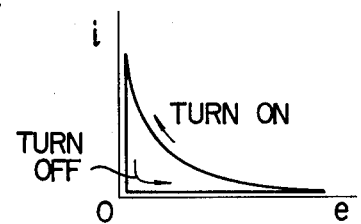

Referring to FIG. 4, there is illustrated a circuit diagram of a switching circuit according to a first embodiment of the present invention which is improved over the switching circuit 2 shown in FIG. 1. This switching circuit is composed of a switching circuit 11 and a switching control circuit 15. FIGS. 5 to 7 are to illustrate operations of the switching circuit.

Figure 3:
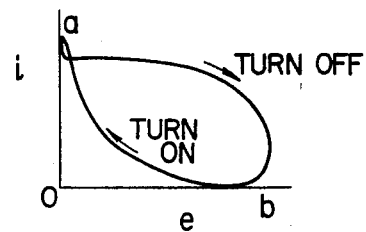

The switching circuit according to the first embodiment of the invention is directed to an improvement for decreasing power loss which is significant particularly, in the case of a conventional DC-DC converter, in the breaking of the switching circuit in changing from the conducting state thereof to the non-conducting or blocking state, as described hereinbefore in conjunction with FIG. 3. To this end, the basic concept of the present invention contained in the first embodiment resides in a step $\Delta e$ being imparted to the voltage waveform e at the onset when the switching circuit changes from a conducting state to a non-conducting or blocking state, as is illustrated at FIG. 6(a) so that the current i becomes equal to zero during a time interval in which the voltage e is present, to thereby separate the time interval in which the voltage e is present from the time interval during which the current i is flowing. Thus, in the breaking of the switching circuit from a conducting state to a non-conducting state, the voltage-current curve passes by the vicinity of its origin (where $e=0$ and $i=0$).

The quantity $\Delta e$ as required can be determined in the manner mentioned below. Referring to FIG. 1, it is assumed that the voltage of the DC power supply source 1 is represented by E, the ratio of the number of turns between the primary and secondary windings of the transformer 3 is given by N:1, resistance values of the primary and secondary windings are represented by $r_1$ and $r_2$, respectively, a voltage drop produced across the diode 4 is represented by $V_f$ and the voltage appearing across the capacitor 5 is represented by $e_c$. Then, the following expression applies valid.

$$E - ir_1 = N(e_c + V_f + N i r_2) \quad (1)$$

Further, when the current i is caused to be zero due to the step $\Delta e$, the following expression applies valid.

$$E - \Delta e = N(e_c + V_f) \quad (2)$$

Thus, from the expressions (1) and (2), $$\Delta e = ir_1 + N^2 i r_2 \quad (3)$$

Accordingly, when the step $\Delta e$ is set at a value as small as possible while satisfying the condition that $\Delta e \geq ir_1 + N^2 i r_2$, the desired object can be accomplished. Since $ir_1 + N^2 i r_2 \approx 0.05E$ is the result of the typical efficiency for a transformer in general, the changes in the voltage e and the current i brought about upon breaking of the turn-off operation of the switching circuit 3 will follow the curve which passes right by the origin (where $e=0$ and $i=0$), as will be seen in FIG. 7, whereby the area defined by the voltage-current (v−i) curve can be surprisingly decreased as compared with the case illustrated in FIG. 3, which causes a corresponding reduction of the power loss in the breaking operation.

More particularly, when the breaking or turning-off operation is carried out with the step $\Delta e$ of a predetermined duration being applied immediately before application of the switching voltage e, current i will decrease from its original value to zero within the time duration of the $\Delta e$ application while only the low voltage $\Delta e$ is applied across the switching circuit. After the current transition is completed, the voltage across the switching circuit is restored from $\Delta e$ to e. In this way, the switching of voltage and that of current can be separated from each other, whereby the power loss brought about by the switching operation can be decreased.

FIG. 4 shows a circuit arrangement of the switching circuit for producing the step voltage $\Delta e$ in the predetermined timing. Referring to the figure, the switching current 11 is composed of a first switching transistor 12, a second switching transistor 13 connected in parallel to the first switching transistor 12 and a Zener diode 14 connected in series with the emitter of the second switching transistor 13. The Zener diode 14 serves to produce the voltage drop $\Delta e$. In the switching (turn-off) process from the conducting state to the non-conducting or blocking state, the first switching transistor 12 is turned off before the turn-off of the second switching transistor 13, as the result of which the step voltage $\Delta e$ is produced for a predetermined time which corresponds to difference in the time at which the first and the second switching transistors 12 and 13 are turned off, as will be seen from the voltage waveform illustrated in FIG. 6 at (a).

The time difference mentioned above can be controllably set by the switching control circuit 15 shown in FIG. 4. More particularly, the switching control circuit 15 comprises a rectangular waveform generator 16 for producing a rectangular waveform signal whose half period substantially corresponds to the conducting time $t_o$ of the switching transistor 13, as is illustrated in FIG. 5 at (a), an inverter 17 for inverting the waveform of the signal output from the rectangular waveform generator 16 to thereby produce a rectangular waveform signal shown in FIG. 5 at (b), and a monostable multivibrator 18 which responds to the falling edge of the rectangular waveform outputted from the inverter 17 for producing a rectangular waveform signal having a pulse duration of $t_1$ which is shorter than the aforementioned conducting time $t_o$, as shown in FIG. 5 at (c), wherein the output signal from the rectangular wave generator 16 shown at (a) in FIG. 5 and the output signal (c) of the monostable multivibrator 18 are supplied to the switching transistors 13 and 12, respectively.

With the circuit arrangement described above, when the switching transistors 13 and 12 turned on by positive portions of the rectangular waveform signals (a) and (c) transfer from the conducting state to the non-conducting state, the transistor 12 is first turned off, while the transistor 13 still remains in the conducting state, whereby the step voltage $\Delta e$ shown in FIG. 6 at (a) is produced by the Zener diode 14 for the time duration $t_2$. Since the step $\Delta e$ is so set that the condition described hereinbefore may be satisfied, the current i decreases toward zero starting from the time point at which the transistor 12 is turned off, as is seen in FIG. 6 at (b), and the transistor 13 is turned off upon lapse of the time $t_2$ after the current i has reached the zero level, whereupon the voltage e makes appearance between output terminals A and B of the switching circuit 11. In this way, switching of the current i and that of the voltage e can be separated, and thus the power loss ascribable to the switching or turn-off operation can be significantly reduced, as will be seen from the curve labelled "TURN OFF" in FIG. 7.

Figure 8:
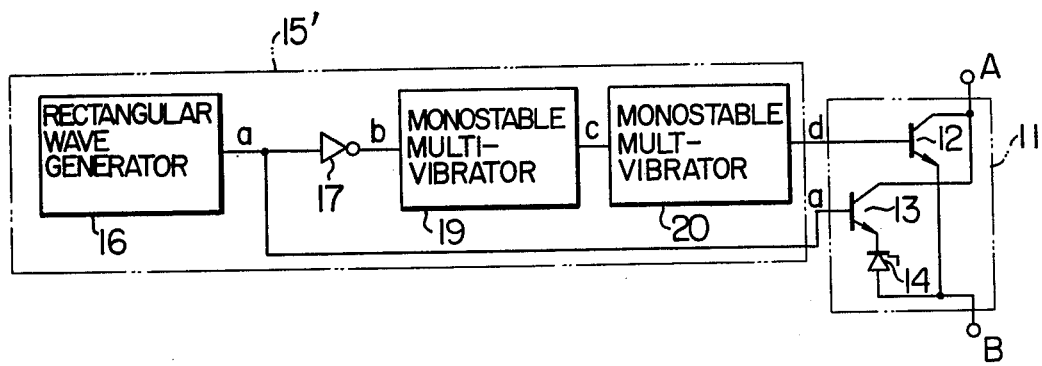
FIG. 8 is a circuit diagram showing a switching circuit for the DC-DC converter according to a second embodiment of the present invention.
Figure 9:
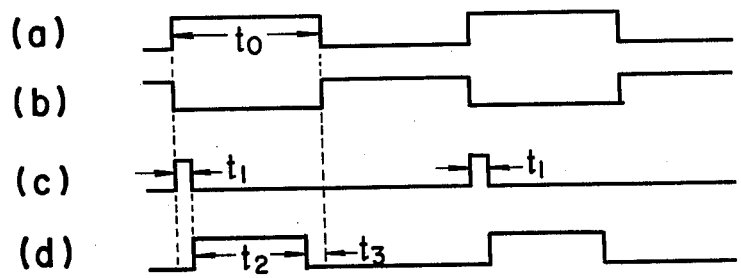
FIG. 9 is a timing chart to illustrate operations of major components of the switching circuit shown in FIG. 8.
Figure 10:
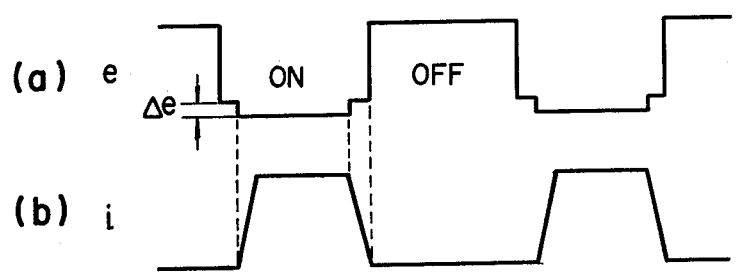
FIGS. 10 and 11 show waveform diagrams of voltage and current produced upon switching operation of the switching circuit shown in FIG. 8.
Figure 11:
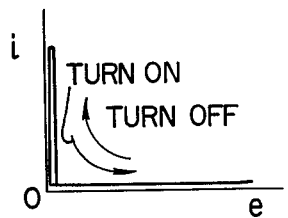

FIG. 8 shows the switching circuit according to a second embodiment of the invention which is capable of further decreasing the power loss, and FIGS. 9 to 11 illustrate operations of the switching circuit. The basic concept of the invention embodied in this switching circuit is in essence same as the one adopted in the first embodiment described above except that the step Δe is positively provided not only upon the switching operation from the conducting state to the non-conducting state but also upon the switching operation from the non-conducting state to the conducting state with the objective of further reducing the power loss involved in the switching operation.

Referring to FIG. 8, the switching circuit 11 differs from the circuit arrangement shown in FIG. 4 only in that two monostable multivibrators 19 and 20 are provided in order to make available the step voltage Δe also in the turn-on process. Describing operation of this switching circuit, the switching transistor 13 is controlled by the output signal of the generator 16 which produces the rectangular wave shown in FIG. 9 (a) in the same manner as the case of the switching circuit shown in FIG. 4. However, in the switching circuit shown in FIG. 8, the monostable multivibrator 19 is triggered in response to the falling edge of the output signal of the inverter 17 (FIG. 9, (b)), to produce a pulse signal having a pulse duration $t_1$ as is illustrated in FIG. 9 (c). Subsequently, the other monostable multivibrator 20 is triggered in response to the falling edge of the pulse signal (c), to produce another pulse signal having a pulse duration $t_2$ as shown in FIG. 9 (d). The switching transistor 12 is controlled by this pulse signal (d). During a period $t_0 = t_1 + t_2 + t_3$, the transistor 13 is in the conducting state, while the transistor 12 is conducting during the time interval $t_2$. As the consequence, the steps Δe are imparted to the voltage waveform e during the time intervals $t_1$ and $t_3$, and the voltage-current curve passes right by the origin (where $e=0$ and $i=0$), as is indicated by a curve labelled "TURN ON" in FIG. 11. It will be seen that the both areas enclosed by "TURN ON" curve and both axes (i.e. i- and e-axes) and "TURN OFF" curve and both axes are surprisingly decreased, which means that the power loss is significantly reduced in both the turn-off and turn-on operations.

As will be appreciated from the foregoing description, the present invention makes it possible to separate the switching of voltage and that of current from each other and allows the switching operation with a significantly reduced power loss or without any appreciable power loss. The operation efficiency of the DC-DC converter incorporating the switching circuit can thus be remarkably improved.

One of the most important advantages of the invention resides in that the power loss can be reduced to a minimum or even to zero regardless of switching steepness (i.e. dv/dt) by virtue of the fact that the voltage-current curve passes right by the origin as illustrated in FIGS. 7 and 11. By making use of this advantageous feature, it is possible to realize the DC-DC converter of low noise. Moreover, in the case of the known DC-DC converter, it is impossible to set the transient time longer than 1/50 of the switching period in view of the heat generation as well as the operation efficiency, which impares a limitation on any attempt to minimize noise. In contrast with the known DC-DC converter, it is possible to set the transient time up to about 1/5 of the period according to the invention which thus makes a great contribution to realization of noise suppression in the DC-DC converter.

I claim:

1. A DC-DC converter in which a DC voltage is intermittently applied to a primary side of a transformer from a DC power supply source to obtain a secondary voltage from a secondary side of said transformer, comprising:
   (a) a switching circuit connected between said power supply source and the primary side of said transformer to perform repeatedly turn-on and blocking operations, said switching circuit setting a predetermined terminal voltage at a predetermined level at which current in the primary side of said transformer ceases to flow in the switching process from the conducting state to the blocking state; and
   (b) a switching control circuit connected to said switching circuit for controlling the conduction and the blocking of said switching circuit and a time interval during which said predetermined terminal voltage is set.

2. A DC-DC converter according to claim 1, wherein said switching circuit includes:
   (a) an element for deriving said predetermined voltage;
   (b) a first switching element connected in series to said element and controlled in respect with the conduction time by a first conduction control signal supplied from said switching control circuit; and
   (c) a second switching element connected in parallel to the series connection of said element and said first switching element and controlled in respect with the conduction time thereof by a second control signal which is supplied from said switching control circuit and which has a duration ending at a time point preceding the end of the conduction time of said first switching element by said predetermined time.

3. A DC-DC converter according to claim 2, wherein said element is a Zener diode, and said first and second switching elements are transistors, respectively.

4. A DC-DC converter according to claim 2, wherein said switching control circuit includes:
   (a) a first rectangular wave generator for deriving said first conduction control signal to be supplied to said first switching element; and
   (b) a second rectangular wave generator for deriving said second conduction control signal from the rectangular wave outputted from said first rectangular wave generator and supplying said second conduction control signal to said second switching element.

5. A DC-DC converter according to claim 4, wherein said second rectangular wave generator includes:
   (a) an inverter receiving a part of the rectangular wave outputted from said first rectangular wave generator; and
   (b) a monostable multivibrator for deriving said second conduction control signal from the waveform outputted from said inverter.

6. A DC-DC converter in which a DC voltage is intermittently applied to a primary side of a transformer from a DC power supply source to obtain a secondary voltage from a secondary side of said transformer, comprising at least:
   (a) a switching circuit connected between said power supply source and the primary side of said transformer to perform repeatedly turn-on and blocking operations, said switching circuit setting a predetermined terminal voltage at which a current in the primary side of said transformer ceases to flow during first and second preset time intervals in the switching processes from the blocking state to the conducting state and from the conducting state to the blocking state, respectively; and (b) a switching control circuit connected to said switching circuit for controlling the blocking and the turn on operations of said switching circuit and said preset time intervals during which said predetermined terminal voltage is set.

7. A DC-DC converter according to claim 6, wherein said switching circuit comprises:

(a) an element for deriving said predetermined voltage;

(b) a first switching element connected in series to said element and controlled with respect to conduction time by a first conduction control signal supplied from said switching control circuit; and (c) a second switching element connected in parallel to the series connection of said element and said first switching element and controlled with respect to conduction time by a second conduction control signal supplied from said switching control circuit, said second control signal starting at a time point delayed for said first preset time interval relative to a time point at which the conduction of said first switching element begins and ending at a time point preceding the end of the conduction of said first switching element by said second preset time interval.

8. A DC-DC converter according to claim 7, wherein said element is a Zener diode, and said first and second switching elements are transistors, respectively.

9. A DC-DC converter according to claim 7, wherein said switching control circuit includes:

(a) a first rectangular wave generator for deriving said first conduction control signal to be supplied to said first switching element; and (b) a second rectangular wave generator for deriving said second conduction control signal from the rectangular wave outputted from said first rectangular wave generator and supplying said second conduction control signal to said second switching element.

10. A DC-DC converter according to claim 9, wherein said second rectangular wave generator includes:

(a) an inverter receiving a part of the rectangular wave outputted by said first rectangular wave generator;

(b) a first monostable multivibrator for deriving a pulse wave of said first preset time interval from the waveform outputted by said inverter; and (c) a second monostable multivibrator for deriving said second conduction control signal from the waveform outputted by said first monostable multivibrator.

* * * * *